(12) United States Patent
Hayashi

(10) Patent No.: US 11,418,182 B2
(45) Date of Patent: Aug. 16, 2022

(54) SWITCH CIRCUITRY

(71) Applicants: Kabushiki Kaisha Toshiba, Tokyo (JP); Toshiba Electronic Devices & Storage Corporation, Tokyo (JP)

(72) Inventor: Tsuneyuki Hayashi, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 294 days.

(21) Appl. No.: 16/296,893

(22) Filed: Mar. 8, 2019

(65) Prior Publication Data
US 2020/0067501 A1 Feb. 27, 2020

(30) Foreign Application Priority Data
Aug. 24, 2018 (JP) .............................. JP2018-157334

(51) Int. Cl.
*H03K 17/0812* (2006.01)
*H02H 9/04* (2006.01)

(52) U.S. Cl.
CPC ....... *H03K 17/08122* (2013.01); *H02H 9/041* (2013.01)

(58) Field of Classification Search
CPC ....... H03K 17/08122; H03K 17/00122; H02H 9/041; H02H 9/04
See application file for complete search history.

(56) References Cited

U.S. PATENT DOCUMENTS

| | | | |
|---|---|---|---|
| 5,313,923 A * | 5/1994 | Takeuchi | F02D 41/3082 123/497 |
| 5,536,977 A | 7/1996 | Williams | |
| 7,061,302 B2 | 6/2006 | Kondo et al. | |
| 8,116,051 B2 | 2/2012 | Nakahara | |
| 8,937,823 B2 * | 1/2015 | Jones | H03K 17/0812 363/56.02 |
| 9,035,687 B2 * | 5/2015 | Roewe | H03K 17/165 327/309 |

(Continued)

FOREIGN PATENT DOCUMENTS

| | | |
|---|---|---|
| JP | H08-37302 A | 2/1996 |
| JP | 2001-224135 A | 8/2001 |

(Continued)

*Primary Examiner* — Scott Bauer
(74) *Attorney, Agent, or Firm* — Allen & Overy LLP

(57) ABSTRACT

Switch circuitry comprise a boosting circuit, a first switch, and a second switch. The boosting circuit boosts an input voltage. The first switch includes an input part to which the input voltage is applied, an output part which outputs an output voltage based on a voltage applied to the input part, and a driving part to which a driving voltage is applied, the first switch in which a voltage which the boosting circuit outputs is applied to the driving part and which outputs the output voltage based on the input voltage when the input voltage is higher than the output voltage. The second switch short-circuits the driving part of the first switch and the input part of the first switch when a value obtained by subtracting the input voltage from a voltage applied to the driving part exceeds a driving threshold.

12 Claims, 1 Drawing Sheet

(56) References Cited

U.S. PATENT DOCUMENTS

| | | | |
|---|---|---|---|
| 2009/0147422 A1* | 6/2009 | Nakahara | H03K 17/0822 |
| | | | 361/84 |
| 2009/0315609 A1* | 12/2009 | Nakazono | H03K 19/018571 |
| | | | 327/333 |
| 2011/0101935 A1* | 5/2011 | Nakahara | H02J 7/0031 |
| | | | 323/276 |
| 2019/0036521 A1* | 1/2019 | Wu | H03K 5/24 |
| 2019/0131785 A1* | 5/2019 | Vogt | H02H 11/002 |
| 2019/0207605 A1* | 7/2019 | Kliem | H03K 17/6874 |
| 2019/0363706 A1* | 11/2019 | Shinomiya | H03K 17/06 |
| 2020/0083881 A1* | 3/2020 | Imasato | B60R 16/03 |
| 2020/0091911 A1* | 3/2020 | Iwamizu | H03K 17/08122 |

FOREIGN PATENT DOCUMENTS

| | | |
|---|---|---|
| JP | 2004-312231 A | 11/2004 |
| JP | 2007-19812 A | 1/2007 |
| JP | 2009-147995 A | 7/2009 |
| JP | 5274824 B2 | 8/2013 |
| JP | 2016-158086 A | 9/2016 |

* cited by examiner

SWITCH CIRCUITRY

CROSS REFERENCE TO RELATED APPLICATIONS

This application is based upon and claims the benefit of priority from the prior Japanese Patent Application No. 2018-157334, filed on Aug. 24, 2018, the entire contents of which are incorporated herein by reference.

FIELD

The embodiments of the present invention relate to switch circuitry.

BACKGROUND

In an electronic circuit, a power supply is an essential element for supplying a potential, a current, or the like to each element. As an example, a power supply circuit applies voltage to an external load, but when a potential of the external load is higher than a potential of the power supply, a current sometimes flows back from the external load to the power supply, resulting in a possibility of causing a fault or a defect. This back flow of a current can relatively easily occur, for example, when the power supply becomes a ground potential and the external load has a positive potential, when positive and negative of the power supply are connected in an opposite manner, or the like. In order to prevent this back flow, switch circuitry is provided for the power supply. The switch circuitry is mounted by providing two MOSFETs (Metal-Oxide-Semiconductor Field-Effect-Transistor) in a back-to-back state between a power supply terminal and an output terminal, for example.

DETAILED DESCRIPTION

According to one embodiment switch circuitry comprise a boosting circuit, a first switch, and a second switch. The boosting circuit boosts an input voltage. The first switch includes an input part to which the input voltage is applied, an output part which outputs an output voltage based on a voltage applied to the input part, and a driving part to which a driving voltage is applied, the first switch in which a voltage which the boosting circuit outputs is applied to the driving part and which outputs the output voltage based on the input voltage when the input voltage is higher than the output voltage. The second switch short-circuits the driving part of the first switch and the input part of the first switch when a value obtained by subtracting the input voltage from a voltage applied to the driving part exceeds a driving threshold.

Embodiments will now be explained with reference to the accompanying drawings. The present invention is not limited to the embodiments.

Figure 1:
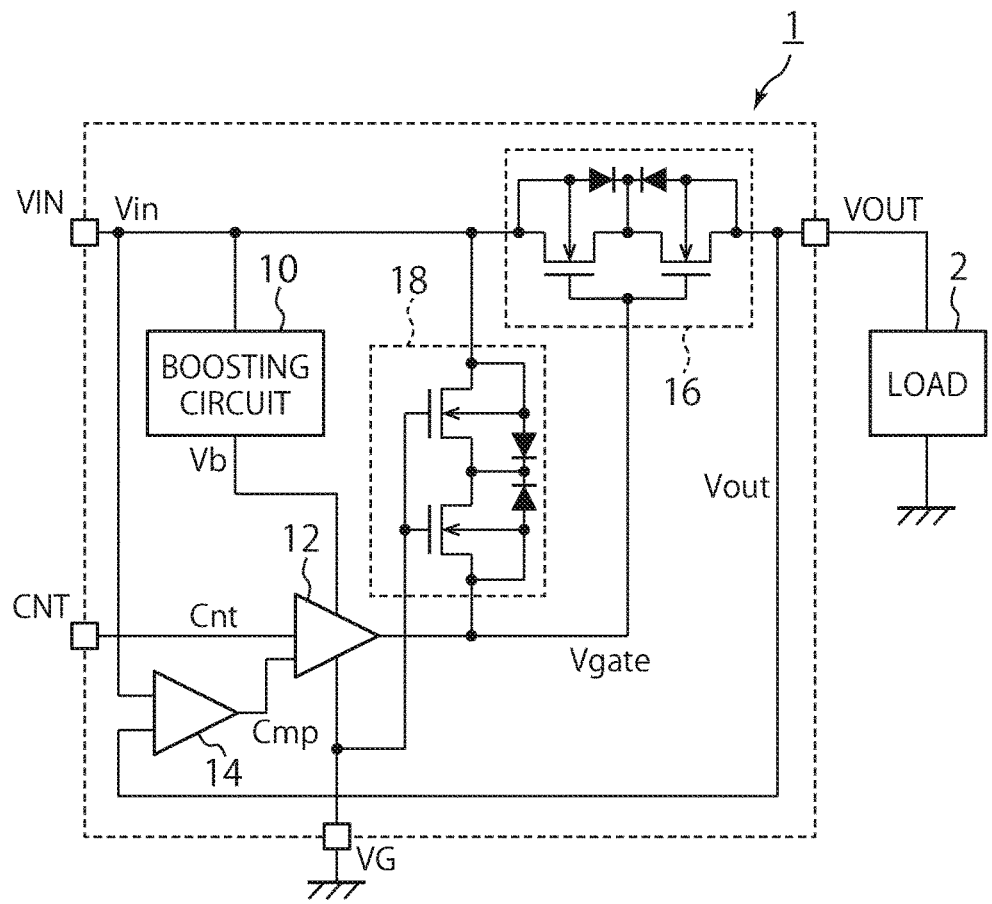
FIG. 1 illustrates an example of switch circuitry according to one embodiment.

FIG. 1 is a circuitry diagram illustrating an example of switch circuitry according to this embodiment. When a power supply voltage is applied from an input terminal VIN, switch circuitry 1 applies a voltage to a load 2 connected to an output terminal VOUT based on a control signal inputted to a control terminal CNT. This switch circuitry 1 includes a boosting circuit 10, a driver 12, a comparator 14, a first switch 16, and a second switch 18, and as terminals, includes an input terminal VIN, an output terminal VOUT, a control terminal CNT, and a ground terminal VG.

To the input terminal VIN, an input voltage Vin is applied, and from the output terminal VOUT, an output voltage Vout is outputted. The control terminal CNT is a terminal to which a signal to control on/off of the switch circuitry 1 is inputted, and for example, when the output voltage Vout is outputted, a signal to turn the switch circuitry 1 on is inputted from the control terminal CNT, and when a voltage is not outputted from the output terminal VOUT, a signal to turn the switch circuitry 1 off is inputted. The ground terminal VG is a terminal connected with a ground surface GND outside the switch circuitry 1.

The boosting circuit 10 is connected between the input terminal VIN and the driver 12, and is a circuit which boosts the input voltage Vin applied to the input terminal VIN up to a driving voltage for driving the first switch 16 which the driver 12 outputs. In order to output the output voltage Vout via the first switch 16, for the driving thereof, it is necessary to apply a voltage of Vout+Vth1 being a voltage obtained by adding a threshold voltage Vth1 (driving threshold), and therefore, by this boosting circuit 10, the input voltage Vin is boosted up to a sufficient voltage to drive the first switch 16. The boosting circuit 10 is formed to include a charge pump or the like, for example.

The driver 12 is connected with the boosting circuit 10 (for example, corresponding to Vdd) and the ground terminal VG (for example, corresponding to Vss) as a power supply and connected with the control terminal CNT and the comparator 14 as an input for control, and an output thereof is connected into a driving part of the first switch 16. In a case where the signal to turn the switch circuitry 1 on is inputted to the control terminal CNT and a case of being the input voltage Vin the output voltage Vout, the input voltage boosted by the boosting circuit 10 is applied so that the first switch 16 is driven. Thus, the driver 12 is connected with the boosting circuit 10 and grounded as a voltage source thereof, and outputs a boosted voltage or a ground voltage as the output voltage.

When the signal to turn the switch circuitry 1 off is inputted from the control terminal CNT, the driver 12 transforms a voltage of the driving part of the first switch 16 into a GND voltage, thereby turning the first switch 16 off and preventing a voltage from being outputted. On the other hand, in a case of being the input voltage Vin<the output voltage Vout, a current flows from the output terminal VOUT to the input terminal VIN side via the first switch 16, and therefore, the driver 12 transforms the voltage of the driving part of the first switch 16 into the GND voltage and turns the first switch 16 off to prevent the current from flowing back.

The comparator 14 is connected to the input terminal VIN and the output terminal VOUT, and an output thereof is connected into the driver 12. The comparator 14 compares the input voltage Vin and the output voltage Vout, acquires a differential voltage between the input voltage Vin and the output voltage Vout, and outputs a signal based on the voltage to the driver 12. The driver 12 performs the above-described processing based on the output of the comparator 14.

The first switch 16 is connected between the input terminal VIN and the output terminal VOUT, and the driving part thereof is connected to the driver 12. The first switch 16, based on a voltage applied by the driver 12, transmits the input voltage Vin to the output terminal VOUT, and outputs the voltage as the output voltage Vout to the external load 2. As a matter of convenience, a connection part with the input terminal VIN is mentioned as an input part, and a connection part with the output terminal VOUT is mentioned as an output part.

The second switch 18 is connected between the input terminal VIN and an output of the driver 12, namely, connected between the input terminal VIN and the driving part of the first switch 16, and a driving part thereof is grounded. In a case where a potential of the input terminal VIN becomes lower than that of the GND and a difference therebetween exceeds a threshold voltage Vth2 (driving threshold), namely, a case of being GND−Vin>Vth2, the second switch 18 electrically connects (short-circuits) the driving part and the input part of the first switch 16, and potentials of the driving part and the input part of the first switch 16 are set to be at the same potential, thereby maintaining an off state of the first switch 16.

Figure 2:
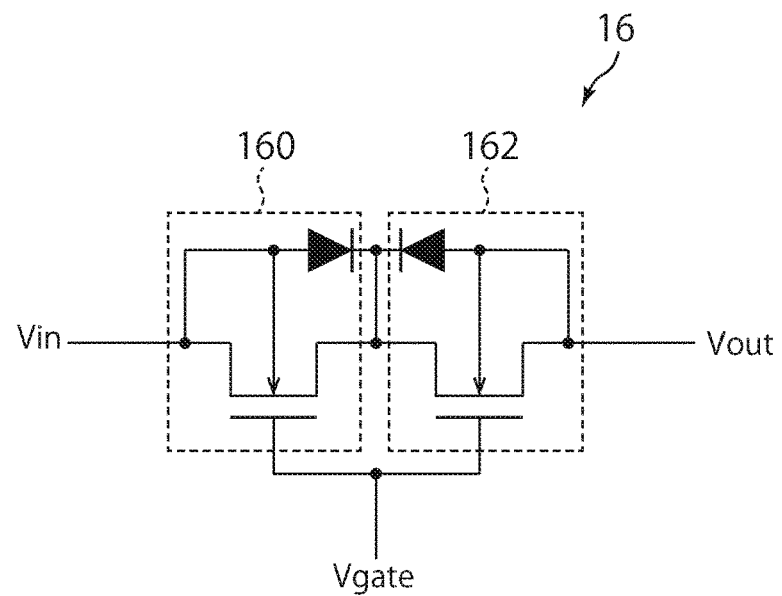
FIG. 2 illustrates an example of a first switch.

FIG. 2 is a diagram illustrating an example of mounting of the first switch 16. The first switch 16 is configured to include transistors 160, 162 being two n-type MOSFETs. The two transistors 160, 162 are disposed such that their drains are connected with each other and their gates are connected with each other. A source of the transistor 160 is connected with the input part, and a source of the transistor 162 is connected with the output part. Diodes illustrated in the diagram are the ones explicitly illustrating body diodes existing in the MOSFETs, and it does not mean that an additional diode is included.

In order to make the first switch 16 function as a switch element, for example, only the transistor 162 is also considered to be set as the first switch 16. However, in this case, since the body diodes exist as illustrated in the diagram, in a case where a potential on the output terminal side becomes higher than a potential on the input terminal side, being only the transistor 162 causes a current to flow from the output side to the input side via the body diode regardless of a voltage applied to the gate. In order to prevent the above, with respect to the transistor 162, the transistor 160 is connected in a back-to-back state.

Thus, by connecting the two transistors 160, 162, in a case where a voltage exceeding the threshold voltage Vth1 as the entire first switch 16 is applied by voltage applied to the gates, a current flows from an input side (drain side) to an output side (source side) similarly to a normal transistor, but in a different case from the above, since the two body diodes are of opposite polarity, a voltage is not passed through either direction in the first switch 16. For example, when the transistor 160 and the transistor 162 are the transistors having the same characteristic, the threshold voltage Vth1 may be equal to a threshold voltage of either of the transistors.

The second switch 18 is not illustrated, but is configured to include two transistors similarly to the first switch 16. However, it is desirable that the threshold voltage Vth2 of the second switch 18 has a magnitude of equal to or less than the threshold voltage Vth1 of the first switch 16, namely to be Vth2 Vth1.

An operation of the overall switch circuitry 1 will be explained hereinafter.

When the switch circuitry 1 is turned off by the control signal Cnt, the driver 12 outputs the GND voltage. This transforms Vgate into the GND voltage, and turns the first switch 16 off. When the switch circuitry 1 is turned on by the control signal Cnt, the driver 12 outputs a boosted voltage Vb boosted by the boosting circuit 10 as Vgate and turns the first switch 16 on.

In a case of being the input voltage Vin the output voltage Vout, the boosting circuit 10 boosts a boosted voltage Vg so as to become Vg>Vout+Vth1. This leads to Vgate>Vout+Vth1, and therefore, the first switch 16 is turned on, a current flows from the input terminal VIN side (input part) to the output terminal VOUT side (output part) in the first switch 16, and the output voltage Vout based on the input voltage Vin is outputted to the external load 2.

In this state, a drop in a voltage applied to the input terminal VIN sometimes causes GND<Vin<Vout. In such a case, the comparator 14 outputs a differential voltage indicating Vin<Vout to the driver 12. When the driver 12 determines to be Vin<Vout, it outputs not the voltage Vb boosted by the boosting circuit 10 but a ground voltage GND as Vgate. As a result, the gates of the first switch 16 are grounded and the first switch 16 is turned off. Moreover, in the first switch 16, since the body diodes of the two transistors 160, 162 are of opposite polarity, a current does not flow back from the output terminal Vout side (output part) to the input terminal Vin side (input part) via the body diodes.

In the above-described flow, in any case, due to a ground for gates of the second switch 18 and further due to being GND<Vin, potentials of drains and sources do not become lower than potentials of the gates, and the second switch 18 maintains an off state. Therefore, such a state as is set to GND<Vin prevents excess electric power from being consumed in the second switch 18, and does not affect other circuits in the switch circuitry 1 either. Further, a current via the body diodes from Vgate to Vin is not generated due to a reason similar to that in the above-described first switch 16 either.

Also in a case of a voltage being Vin=GND, since a power supply which operates the switch circuitry 1 does not exist, the circuits inside the switch circuitry 1 become an off state, and the first switch 16 also becomes an off state. Besides, a ground in a manner that the body diodes are of opposite polarity also prevents generation of a backflow current via the body diodes.

Being Vin<GND and being GND−Vin>Vth2 cause the second switch 18 to be turned on and cause a short-circuit state between Vgate and Vin, and therefore Vgate and Vin are controlled so as to become an equal voltage. In a case of being Vth2<Vth1, as a result, a potential difference between the gate and the source (input part side) of the first switch 16 does not become equal to or more than Vth1, and therefore, the first switch 16 does not become an on state, and a current does not flow back from the output terminal VOUT side to the input terminal VIN side.

Also in a case of being Vth1 Vth2, even though a current transiently flows back from the output terminal VOUT to the input terminal VIN side, the back-flowing current is decreased from timing of being GND−Vin>Vth2. At any rate, since the back-flowing current is preferably small, being Vth1>Vth2 is more desirable.

As described above, according to this embodiment, it becomes possible to prevent a backflow current from the output terminal VOUT connected with the load such as an internal battery, which has been difficult to prevent in a conventional configuration, for example, a configuration in which the second switch does not exist but only the first switch exists, and which is generated when a potential of the input terminal VIN becomes lower than the lowest potential GND in the circuitry, by setting the gates and the source of the first switch 16 to be at the same potential with the second switch 18 based on conditions in which the backflow current flows through the first switch 16. Preventing such a backflow current, for example, suppresses unnecessary consumption of a battery and leads to a decrease in the number of times of charge and discharge, resulting in making it possible to contribute to extending a lifetime of the battery. Further, by preventing an excessive charge, consideration to the environment is also given.

Note that in the above-described embodiment, due to low on-resistance and for the purpose of suppressing heat generation at a switching-on time and an output voltage drop caused by the on-resistance, n-type MOSFETs are used in the first switch 16 and the second switch 18, but without being limited to this, depending on a factor in design or the like, p-type MOSFETs may be used. In this case, a relationship for a voltage applied to gates, or the like is adjusted such that the p-type MOSFETs are operated and non-operated. In addition, as further another example, without being limited to the MOSFET, another transistor or the like, for example, a bipolar transistor or the like may be used. In this case, appropriately, a gate is replaced with a base, a drain or a source is replaced with an emitter or a collector.

Further, the driver 12 is driven by the control signal Cnt inputted to the control terminal CNT, but without being limited to this, the boosting circuit 10 may also be controlled so as to be driven when the switch circuitry 1 is turned on by the control signal Cnt and so as not to be driven when it is turned off.

The driving part of the second switch 18 is grounded, but without being limited to this, a predetermined voltage may be applied thereto. This predetermined voltage is set not to exceed the threshold voltage Vth2 of the second switch 18. This allows Vin and Vgate to be controlled in an earlier step when Vin is below GND.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. Switch circuitry comprising:
a boosting circuit which boosts an input voltage;
a first switch including an input part to which the input voltage is applied, an output part which outputs an output voltage based on a voltage applied to the input part, and a driving part to which a driving voltage is applied, the first switch in which a voltage which the boosting circuit outputs is applied to the driving part and which outputs the output voltage based on the input voltage when the input voltage is higher than the output voltage; and
a second switch which short-circuits the driving part of the first switch and the input part of the first switch when a value obtained by subtracting the input voltage from a voltage applied to a driving part of the second switch exceeds a driving threshold.

2. The switch circuitry according to claim 1,
wherein a voltage which the boosting circuit outputs is not applied to the driving part of the first switch when the input voltage is lower than the output voltage.

3. The switch circuitry according to claim 1,
wherein in the second switch circuit, with two n-type MOSFETs in a back-to-back state, drains of the MOSFETs are connected with each other and gates of the MOSFETs are connected with each other, and a source of one of the MOSFETs is connected with the input part of the first switch, a source of the other MOSFET is connected with the driving part of the first switch, and gates connected with each other are the driving part.

4. The switch circuitry according to claim 3,
wherein the gates of the MOSFETs of the second switch circuit are grounded.

5. The switch circuitry according to claim 1,
wherein in the first switch circuit, with two n-type MOSFETs in a back-to-back state, drains of the MOSFETs are connected with each other and gates of the MOSFETs are connected with each other, and a source of one of the MOSFETs is the input part, a source of the other MOSFET is the output part, and gates connected each other are the driving part.

6. The switch circuitry according to claim 1,
wherein a driving threshold of the second switch is a lower value than the driving threshold of the first switch.

7. Switch circuitry comprising:
a boosting circuit which is connected with an input terminal;
a comparator which is connected with the input terminal and an output terminal;
a driver which is connected between the boosting circuit and a ground point as a voltage source and connected with a control terminal to which a control signal is inputted and an output of the comparator;
a first switch which is connected between the input terminal and the output terminal and whose driving part is connected with the driver; and
a second switch whose driving part is grounded and which is connected between the input terminal which is connected with an input part of the first switch and the driving part of the first switch, and which short-circuits the driving part of the first switch and the input part of the first switch when a value obtained by subtracting the input voltage from a voltage applied to the driving part of the second switch exceeds a driving threshold.

8. The switch circuitry according to claim 7,
wherein a voltage which the boosting circuit outputs is not applied to the driving part of the first switch when the input voltage is lower than the output voltage.

9. The switch circuitry according to claim 7,
wherein in the second switch circuit, with two n-type MOSFETs in a back-to-back state, drains of the MOSFETs are connected with each other and gates of the MOSFETs are connected with each other, and a source of one of the MOSFETs is connected with the input part of the first switch, a source of the other MOSFET is connected with the driving part of the first switch, and gates connected with each other are the driving part.

10. The switch circuitry according to claim 9,
wherein the gates of the MOSFETs of the second switch circuit are grounded.

11. The switch circuitry according to claim 7,
wherein in the first switch circuit, with two n-type MOSFETs in a back-to-back state, drains of the MOSFETs are connected with each other and gates of the MOSFETs are connected with each other, and a source of one of the MOSFETs is the input part, a source of the other MOSFET is the output part, and gates connected each other are the driving part.

12. The switch circuitry according to claim 7, wherein a driving threshold of the second switch is a lower value than the driving threshold of the first switch.

* * * * *